US012690328B2

(12) United States Patent
Zhang

(10) Patent No.: US 12,690,328 B2
(45) Date of Patent: Jul. 21, 2026

(54) DISPLAY PANEL, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Qianyi Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 685 days.

(21) Appl. No.: 17/756,651

(22) PCT Filed: Apr. 22, 2022

(86) PCT No.: PCT/CN2022/088489
§ 371 (c)(1),
(2) Date: May 29, 2022

(87) PCT Pub. No.: WO2023/197359
PCT Pub. Date: Oct. 19, 2023

(65) Prior Publication Data
US 2024/0164143 A1     May 16, 2024

(30) Foreign Application Priority Data
Apr. 14, 2022     (CN) .......................... 202210395033.5

(51) Int. Cl.
*H10K 59/122*     (2023.01)
*H10K 59/12*      (2023.01)
*H10K 59/80*      (2023.01)

(52) U.S. Cl.
CPC ....... *H10K 59/122* (2023.02); *H10K 59/1201* (2023.02); *H10K 59/80522* (2023.02)

(58) Field of Classification Search
CPC ............. H10K 59/122; H10K 59/1201; H10K 59/80522
(Continued)

(56) References Cited

U.S. PATENT DOCUMENTS

2010/0193794 A1* 8/2010 Kim ..................... H10K 50/818
257/59
2011/0084257 A1     4/2011 Kwon et al.
(Continued)

FOREIGN PATENT DOCUMENTS

CN     106611769 A     5/2017
CN     108022948 A     5/2018
(Continued)

OTHER PUBLICATIONS

International Search Report in International application No. PCT/CN2022/088489,mailed on Nov. 30, 2022.
(Continued)

*Primary Examiner* — Dzung Tran
(74) *Attorney, Agent, or Firm* — PV IP PC; Wei Te Chung

(57) ABSTRACT

A display panel, a manufacturing method, and a display device are provided. The display panel includes a substrate, a thin film transistor layer, and a first electrode layer and a pixel definition layer disposed on the thin film transistor layer. The first electrode layer includes a plurality of electrodes. One of protection electrodes is disposed between one of the electrodes and the pixel definition layer. The protection electrodes are disposed around peripheral sides of the electrodes.

19 Claims, 5 Drawing Sheets

(58) Field of Classification Search
USPC ........................................................ 257/72
See application file for complete search history.

(56) References Cited

U.S. PATENT DOCUMENTS

| | | | | |
|---|---|---|---|---|
| 2011/0140138 A1* | 6/2011 | Ko | ...................... | H10K 50/818 |
| | | | | 257/89 |
| 2011/0291085 A1* | 12/2011 | Kondoh | ................. | H10K 50/17 |
| | | | | 438/34 |
| 2014/0353620 A1* | 12/2014 | Park | ..................... | H10K 50/844 |
| | | | | 438/34 |
| 2016/0020422 A1 | 1/2016 | Kim et al. | | |
| 2016/0043341 A1* | 2/2016 | Heo | ..................... | H10K 59/122 |
| | | | | 438/23 |
| 2016/0149155 A1* | 5/2016 | Kim | ..................... | H10K 59/124 |
| | | | | 438/23 |
| 2017/0062755 A1* | 3/2017 | Im | ........................ | H10K 59/126 |
| 2017/0207416 A1* | 7/2017 | Kim | ........................ | H10K 50/15 |
| 2018/0122877 A1* | 5/2018 | Beak | .................... | H10K 50/814 |

FOREIGN PATENT DOCUMENTS

| | | |
|---|---|---|
| CN | 111463360 A | 7/2020 |
| CN | 111864116 A | 10/2020 |
| CN | 112117357 A | 12/2020 |

OTHER PUBLICATIONS

Written Opinion of the International Search Authority in International application No. PCT/CN2022/088489,mailed on Nov. 30, 2022.
Chinese Office Action issued in corresponding Chinese Patent Application No. 202210395033.5 dated Jan. 21, 2025, pp. 1-7.

* cited by examiner

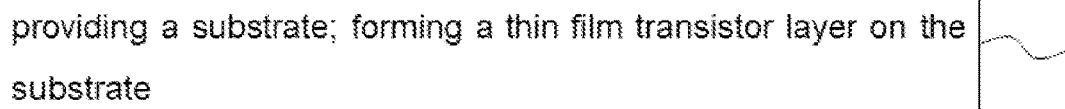

providing a substrate; forming a thin film transistor layer on the substrate ⟋ S100 forming a first electrode layer and protection electrodes on the thin film transistor layer, wherein the first electrode layer includes a plurality of electrodes, and the protection electrodes are disposed around peripheral sides of the electrodes ⟋ S200 forming a pixel definition layer on the thin film transistor layer, wherein openings corresponding to each of the electrodes one by one are formed in the pixel definition layer, and one of protection electrodes is disposed between one of the electrodes and the pixel definition layer ⟋ S300 at least forming an organic light-emitting layer on the first electrode layer; forming a second electrode layer on the organic light-emitting layer ⟋ S400

FIG. 2

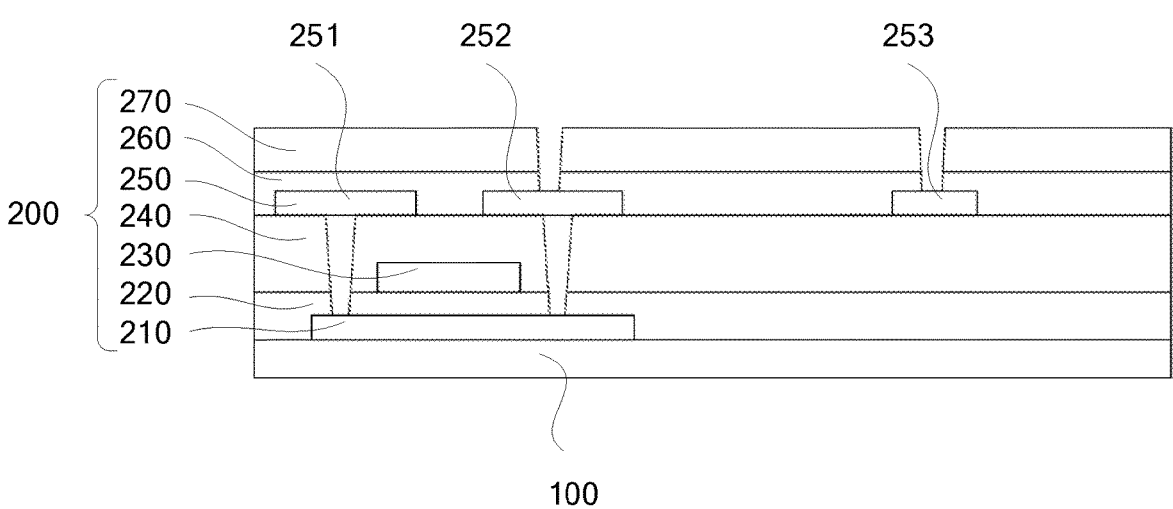

FIG. 3

DISPLAY PANEL, MANUFACTURING METHOD THEREOF, AND DISPLAY DEVICE

BACKGROUND OF INVENTION

Field of Invention

The present application relates to a display field, and particularly relates to a display panel, a manufacturing method thereof, and a display device.

Description of Prior Art

Organic light emitting diode (OLED) displays have been widely used due to having advantages such as super high contrast, wide color gamut, rapid response, self-luminescence, etc. With continuous increment of OLED displays and sizes of OLED televisions, in order to reduce difficulty of printing light-emitting layers, line bank structures are generally adopted in the OLED displays.

Currently, in order to prevent a display problem of abnormal dark spots incurred by foreign matter generated in light-emitting layers and anodes in the OLED displays, a material of the anodes is changed from silver and other materials to materials such as an aluminum alloy. However, the aluminum alloy can be soaked in a developer solution during a manufacturing process of the line banks, which easily leads to corrosion in regions around the anodes.

SUMMARY OF INVENTION

Embodiments of the present application provide a display panel, a manufacturing method thereof, and a display device to solve technical problems such as peripheral sides of anodes made of materials such as aluminum alloy are prone to be corroded during manufacturing processes of line banks.

One embodiment of the present application provides a display panel, including:

a substrate;

a thin film transistor layer disposed on the substrate;

a first electrode disposed on the thin film transistor layer and including a plurality of electrodes;

a pixel definition layer disposed on the thin film transistor layer and including a plurality of openings corresponding to each of the electrodes one by one;

an organic light-emitting layer at least disposed on the first electrode layer corresponding to the openings; and a second electrode layer disposed on the organic light-emitting layer, and wherein one of protection electrodes located on the thin film transistor layer is disposed between one of the electrodes and the pixel definition layer, and the protection electrodes are disposed around peripheral sides of the electrodes.

In the display panel provided by one embodiment of the present application, the electrodes include an electrode body disposed on the thin film transistor layer and an oxidation protection sub-layer disposed on the electrode body;

in one of the electrodes and one corresponding protection electrode, the protection electrode and the oxidation protection sub-layer are connected to form a protection cavity, and the electrode body is disposed in the protection cavity.

In the display panel provided by one embodiment of the present application, the plurality of electrodes include a plurality of anodes, the plurality of openings include a plurality of first openings corresponding to each of the anodes one by one, the plurality of protection electrodes include a plurality of first protection electrodes, one of the first protection electrodes located on the thin film transistor layer is disposed between one of the anodes and the pixel definition layer, the first protection electrodes include a vertical portion disposed on the thin film transistor layer and connected to a lateral side of the oxidation protection sub-layer and a horizontal portion horizontally extending in a direction from the vertical portion to the first openings, and the horizontal portion is at least partially disposed on the oxidation protection sub-layer.

In the display panel provided by one embodiment of the present application, a thickness of the horizontal portion is less than a thickness of the organic light-emitting layer in a direction perpendicular to the substrate.

In the display panel provided by one embodiment of the present application, the plurality of electrodes include a plurality of auxiliary cathodes, the plurality of openings include a plurality of second openings corresponding to each of the auxiliary cathodes one by one, the plurality of protection electrodes include a plurality of second protection electrodes, one of the second protection electrodes located on the thin film transistor layer is disposed between one of the auxiliary cathodes and the pixel definition layer, an undercut opening located between the pixel definition layer and the auxiliary cathodes is defined on a lateral wall of the second openings, the organic light-emitting layer includes a first sub-section disposed on the pixel definition layer and a second sub-section disposed on the auxiliary cathodes, the first sub-section and the second sub-section are spaced apart, and the second electrode layer is disposed on the first sub-section, the second sub-section, and the auxiliary cathodes, and is connected to the auxiliary cathodes.

In the display panel provided by one embodiment of the present application, a thickness of the second protection electrodes is greater than a thickness of the auxiliary cathodes in a direction perpendicular to the substrate, the undercut opening is defined corresponding to the second protection electrodes, the second electrode layer is disposed on the first sub-section, the second sub-section, and the auxiliary cathodes, and the second electrode layer penetrates through the undercut opening and is electrically connected to the second protection electrodes.

In the display panel provided by one embodiment of the present application, the second protection electrodes include a protection segment disposed on the thin film transistor layer and a connection segment extending from the protection segment to a side away from the thin film transistor layer, the protection segment is connected to a lateral side of the oxidation protection sub-layer of the auxiliary cathodes, the undercut opening is defined corresponding to the connection segment, and the second electrode layer penetrates through the undercut opening and is electrically connected to the connection segment.

In the display panel provided by one embodiment of the present application, a depth of the undercut opening ranges from 2 μm to 5 μm in a direction parallel to the substrate.

In the display panel provided by one embodiment of the present application, a material of the protection electrodes includes at least one of an alloy of molybdenum and titanium or titanium.

The present application further provides a manufacturing method of the display panel, including following steps:

providing a substrate; forming a thin film transistor layer on the substrate;

forming a first electrode layer and protection electrodes on the thin film transistor layer, wherein the first electrode layer includes a plurality of electrodes, and the protection electrodes are disposed around peripheral sides of the electrodes;

forming a pixel definition layer on the thin film transistor layer, wherein openings corresponding to each of the electrodes one by one are formed in the pixel definition layer, and one of protection electrodes is disposed between one of the electrodes and the pixel definition layer; and at least forming an organic light-emitting layer on the first electrode layer, and forming a second electrode layer on the organic light-emitting layer.

Correspondingly, the present application further provides a display device. The display device includes a display panel. The display panel includes:

a substrate;

a thin film transistor layer disposed on the substrate;

a first electrode disposed on the thin film transistor layer and including a plurality of electrodes;

a pixel definition layer disposed on the thin film transistor layer and including a plurality of openings corresponding to each of the electrodes one by one;

an organic light-emitting layer at least disposed on the first electrode layer corresponding to the openings; and a second electrode layer disposed on the organic light-emitting layer, and wherein one of protection electrodes located on the thin film transistor layer is disposed between one of the electrodes and the pixel definition layer, and the protection electrodes are disposed around peripheral sides of the electrodes.

In the display device provided by one embodiment of the present application, the electrodes include an electrode body disposed on the thin film transistor layer and an oxidation protection sub-layer disposed on the electrode body;

in one of the electrodes and one corresponding protection electrode, the protection electrode and the oxidation protection sub-layer are connected to form a protection cavity, and the electrode body is disposed in the protection cavity.

In the display device provided by one embodiment of the present application, the plurality of electrodes include a plurality of anodes, the plurality of openings include a plurality of first openings corresponding to each of the anodes one by one, the plurality of protection electrodes include a plurality of first protection electrodes, one of the first protection electrodes located on the thin film transistor layer is disposed between one of the anodes and the pixel definition layer, the first protection electrodes include a vertical portion disposed on the thin film transistor layer and connected to a lateral side of the oxidation protection sub-layer and a horizontal portion horizontally extending in a direction from the vertical portion to the first openings, and the horizontal portion is at least partially disposed on the oxidation protection sub-layer.

In the display device provided by one embodiment of the present application, a thickness of the horizontal portion is less than a thickness of the organic light-emitting layer in a direction perpendicular to the substrate.

In the display device provided by one embodiment of the present application, the plurality of electrodes include a plurality of auxiliary cathodes, the plurality of openings include a plurality of second openings corresponding to each of the auxiliary cathodes one by one, the plurality of protection electrodes include a plurality of second protection electrodes, one of the second protection electrodes located on the thin film transistor layer is disposed between one of the auxiliary cathodes and the pixel definition layer, an undercut opening located between the pixel definition layer and the auxiliary cathodes is defined on a lateral wall of the second openings, the organic light-emitting layer includes a first sub-section disposed on the pixel definition layer and a second sub-section disposed on the auxiliary cathodes, the first sub-section and the second sub-section are spaced apart, and the second electrode layer is disposed on the first sub-section, the second sub-section, and the auxiliary cathodes, and is connected to the auxiliary cathodes.

In the display device provided by one embodiment of the present application, a thickness of the second protection electrodes is greater than a thickness of the auxiliary cathodes in a direction perpendicular to the substrate, the undercut opening is defined corresponding to the second protection electrodes, the second electrode layer is disposed on the first sub-section, the second sub-section, and the auxiliary cathodes, and the second electrode layer penetrates through the undercut opening and is electrically connected to the second protection electrodes.

In the display device provided by one embodiment of the present application, the second protection electrodes include a protection segment disposed on the thin film transistor layer and a connection segment extending from the protection segment to a side away from the thin film transistor layer, the protection segment is connected to a lateral side of the oxidation protection sub-layer of the auxiliary cathodes, the undercut opening is defined corresponding to the connection segment, and the second electrode layer penetrates through the undercut opening and is electrically connected to the connection segment.

In the display device provided by one embodiment of the present application, a depth of the undercut opening ranges from 2 $\mu$m to 5 $\mu$m in a direction parallel to the substrate.

In the display device provided by one embodiment of the present application, a material of the protection electrodes includes at least one of an alloy of molybdenum and titanium or titanium.

Beneficial effect of the present application: by disposing one protection electrode located on the thin film transistor layer between the electrode and the pixel definition layer, and by disposing the protection electrode around the periphery sides of the electrodes, the peripheral sides of the electrodes can be protected by the protection electrodes, and the problem of corrosion of the peripheral sides of the electrodes due to the developer solution contacting to the peripheral sides of the electrodes during the manufacturing process of the line banks can be prevented.

DESCRIPTION OF DRAWINGS

In order to more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which those skilled in the art can derive further figures without making any inventive efforts.

FIG. 2 is a flowchart of a manufacturing method of the display panel provided by one embodiment of the present application.

FIG. 3 to FIG. 9 are structural flowcharts of the manufacturing method of the display panel provided by embodiments of the present application.

DETAILED DESCRIPTION OF EMBODIMENTS

Figure 1:
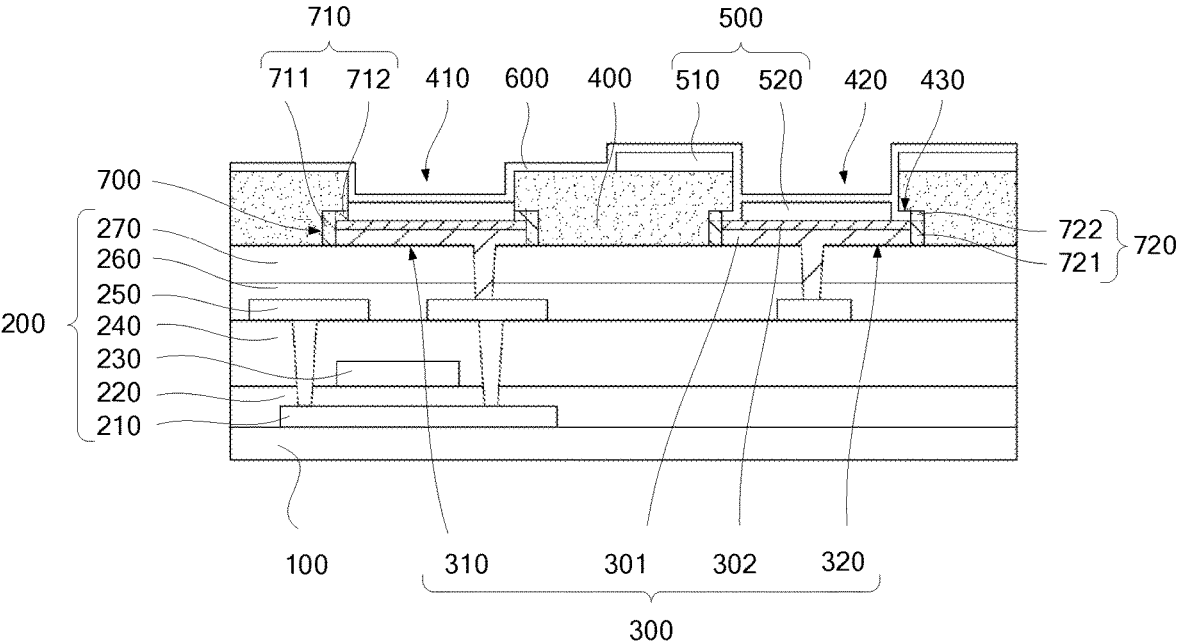
FIG. 1 is a structural schematic diagram of a display panel provided by one embodiment of the present application.
Figure 4:
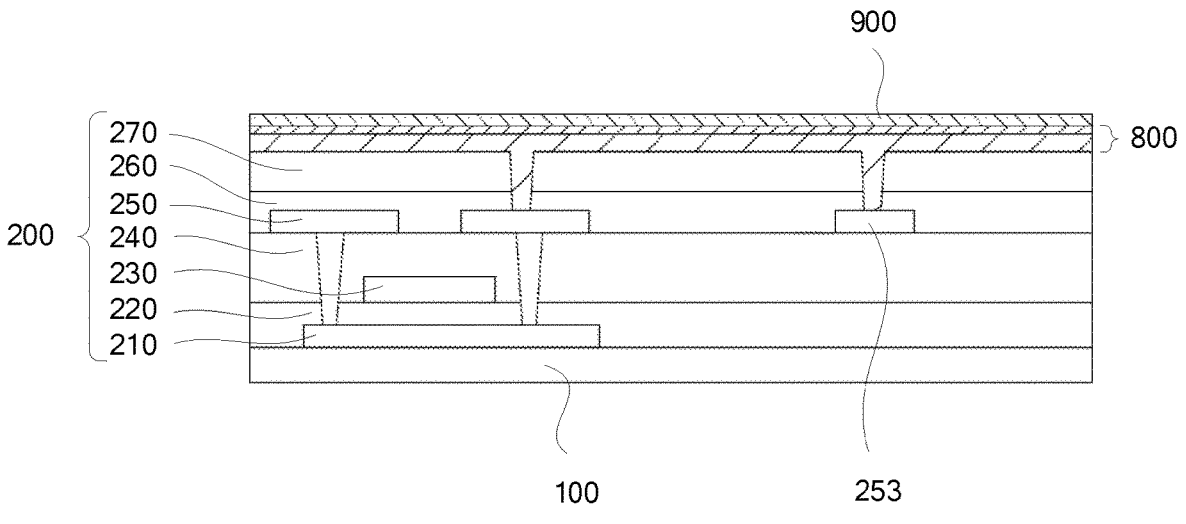

The descriptions of embodiments below refer to accompanying drawings in order to illustrate certain embodiments which the present invention can implement. The directional terms of which the present invention mentions, for example, "top", "bottom", "upper", "lower", "front", "rear", "left", "right", "inside", "outside", "side", etc., are just refer to directions of the accompanying figures. Therefore, the used directional terms are for illustrating and understanding the present disclosure, but not for limiting the present invention. In the figures, units with similar structures are indicated by the same reference numerals.

In description of the present application, it should be understood that the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present application, the meaning of "a plurality" is two or more unless clearly and specifically defined otherwise.

In the description of the present application, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

Now, the technical solutions of the present application are described with reference to specific embodiments.

Please refer to FIG. 1. One embodiment of the present application provides a display panel, including:

a substrate 100;

a thin film transistor layer 200 disposed on the substrate 100;

a first electrode 300 disposed on the thin film transistor layer 200 and including a plurality of electrodes;

a pixel definition layer 400 disposed on the thin film transistor layer 200 and including a plurality of openings corresponding to each of the electrodes one by one;

an organic light-emitting layer 500 at least disposed on the first electrode layer 300 corresponding to the openings; and a second electrode layer 600 disposed on the organic light-emitting layer 500, and wherein one of protection electrodes 700 located on the thin film transistor layer 200 is disposed between one of the electrodes and the pixel definition layer 400; and the protection electrodes 700 are disposed around peripheral sides of the electrodes.

It can be understood that in order to prevent a display problem of abnormal dark spots incurred by foreign matter generated in light-emitting layers and anodes in the OLED displays, a material of the anodes is changed from silver and other materials to materials such as an aluminum alloy. However, the aluminum alloy can be soaked in a developer solution during a manufacturing process of the line banks, which easily leads to corrosion in regions around the anodes. In this embodiment, by disposing one protection electrode 700 located on the thin film transistor layer 200 between the electrode and the pixel definition layer 400, and by disposing protection electrode 700 around the periphery sides of the electrodes, the peripheral sides of the electrodes 700 can be protected by the protection electrodes, and the problem of corrosion of the peripheral sides of the electrodes due to the developer solution contacting to the peripheral sides of the electrodes during the manufacturing process of the line banks can be prevented.

It should be noted that a material of the protection electrode 700 is not easily corroded by a developer solution. Specifically, a material of the protection electrodes 700 includes at least one of an alloy of molybdenum and titanium, or titanium. In addition, the protection electrode 700 can be disposed around the peripheral side of the electrode according to a specific shape of the electrode and can be attached to the lateral side of the electrode.

In one embodiment, please refer to FIG. 1. The electrodes include an electrode body 301 disposed on the thin film transistor layer 200 and an oxidation protection sub-layer 302 disposed on the electrode body 301.

In one of the electrodes and one corresponding protection electrode 700, the protection electrode 700 and the oxidation protection sub-layer 302 are connected to form a protection cavity, and the electrode body 301 is disposed in the protection cavity.

It can be understood that in the manufacturing processes of line banks, in order to prevent the electrode from being soaked in the developing solution and corroding the surface of the electrode, the surface of the electrode is oxidized, so that the electrode includes the electrode body 301 disposed on the thin film transistor layer 200 and the oxidation protection sub-layer 302 disposed on the electrode body 301, thereby preventing the surface of the electrode from being corroded through the protection of the oxidation protection sub-layer 302. Meanwhile, the protection electrodes 700 are connected to the oxidation protection sub-layer 302 to form a protection cavity, and the electrode body 301 is disposed in the protection cavity, thereby enclosing a surface and a peripheral side of the electrode body 301 and preventing the electrode body 301 from being corroded.

Figure 8:
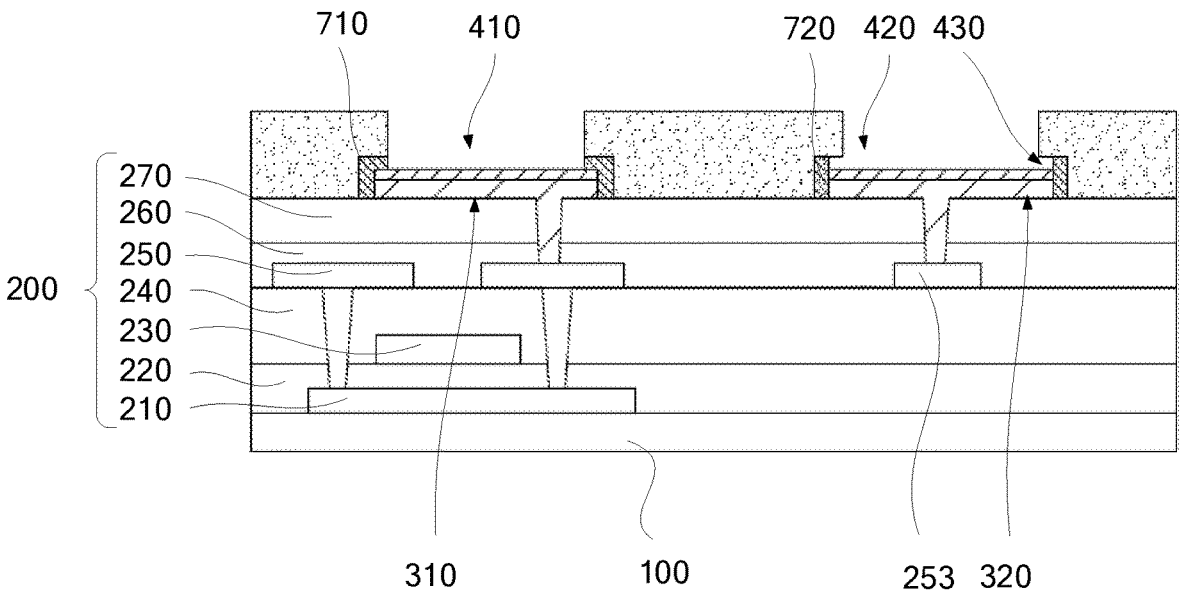
Figure 9:
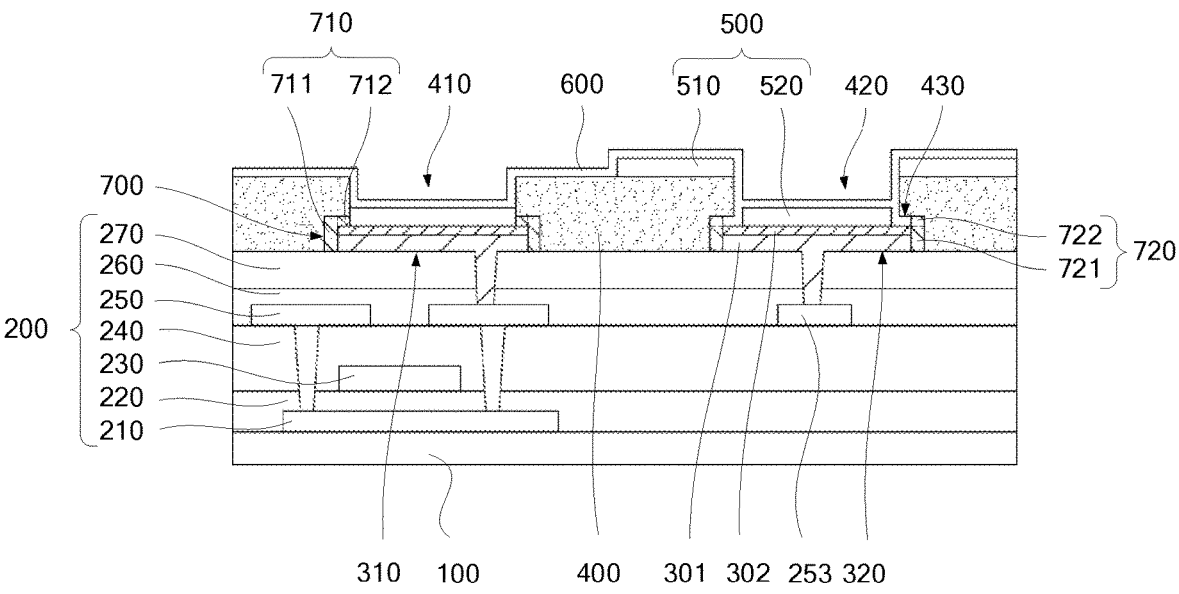

In one embodiment, please refer to FIG. 1, FIG. 8, and FIG. 9. The plurality of electrodes include a plurality of anodes 310. The plurality of openings include a plurality of first openings 410 corresponding to each of the anodes 310 one by one. The plurality of protection electrodes 700 include a plurality of first protection electrodes 710. One of the first protection electrodes 710 located on the thin film transistor layer 200 is disposed between one of the anodes 310 and the pixel definition layer 400.

The first protection electrodes 710 include a vertical portion 711 disposed on the thin film transistor layer 200 and connected to a lateral side of the oxidation protection sub-layer 302 and a horizontal portion 712 horizontally extending in a direction from the vertical portion 711 to the first openings 410, and the horizontal portion 712 is at least partially disposed on the oxidation protection sub-layer 302.

It can be understood that the first protection electrodes 710 include the vertical portion 711 disposed on the thin film transistor layer 200 and connected to the lateral side of the oxidation protection sub-layer 302, i.e., protection of the electrode body 301 can be realized by the protection cavity formed by connecting the vertical portion 711 to the oxidation protection sub-layer 302. Obviously, the first protection electrodes 710 further include the horizontal portion 712 horizontally extending in the direction from the vertical portion 711 to the first openings 410, and the horizontal portion 712 is at least partially disposed on the oxidation protection sub-layer 302, which can further increase an attaching area with the oxidation protection sub-layer 302 to achieve a better protection effect on the electrode body 301.

In one embodiment, please refer to FIG. 1. A thickness of the horizontal portion 712 is less than a thickness of the organic light-emitting layer 500 in a direction perpendicular to the substrate 100.

It can be understood that the thickness of the horizontal portion 712 is less than the thickness of the organic light-emitting layer 500, i.e., at a position of the first opening 410, the organic light-emitting layer 500 can completely cover a lateral surface of the horizontal portion 712. Therefore, short circuit between the second electrode layer 600 on the organic light-emitting layer 500 and the anode 310 through the horizontal portion 712 can be prevented.

In one embodiment, please refer to FIG. 1, FIG. 8, and FIG. 9. The plurality of electrodes include a plurality of auxiliary cathodes 320. The plurality of openings include a plurality of second openings 420 corresponding to each of the auxiliary cathodes 320 one by one. The plurality of protection electrodes 700 include a plurality of second protection electrodes 720. One of the second protection electrodes 720 located on the thin film transistor layer 200 is disposed between one of the auxiliary cathodes 320 and the pixel definition layer 400.

An undercut opening 430 located between the pixel definition layer 400 and the auxiliary cathodes 320 is defined on a lateral wall of the second openings 420. The organic light-emitting layer 500 includes a first sub-section 510 disposed on the pixel definition layer 400 and a second sub-section 520 disposed on the auxiliary cathodes 320. The first sub-section 510 and the second sub-section 520 are spaced apart. The second electrode layer 600 is disposed on the first sub-section 510, the second sub-section 520, and the auxiliary cathodes 320, and is connected to the auxiliary cathodes 320.

It can be understood that the first electrode layer 300 includes the auxiliary cathode 320 and the anodes 310, the auxiliary cathodes 320 and the anodes 310 are disposed in a same layer and are integrated in one piece by adopting a same process, the second protection electrode 720 is configured to connect to the oxidation protection sub-layer 302 of the auxiliary cathode 320 to form the protection cavity, so as to protect the electrode body 301 of the auxiliary cathodes 320, thereby preventing the peripheral side of the auxiliary cathodes 320 from being soaked in the developer solution and corroded.

It should be noted that, currently, in organic light emitting diode (OLED) display devices, a cathode layer is generally made of thin metal silver, which leads to a large resistivity of the cathode layer, thereby resulting in a large difference between an actual driving voltage and a power supply voltage of the OLED display devices. Therefore, large-area uneven brightness can be generated in large-scaled OLED display devices. In this embodiment, by defining the undercut opening 430 located between the pixel definition layer 400 and the auxiliary cathodes 320 on the lateral wall of the second openings 420, the organic light-emitting layer 500 is cut at the position of the undercut opening 430 to form the first sub-section 510 located on the pixel definition layer 400 and the second sub-section 520 located on the auxiliary cathodes 320, thereby facilitate to the second electrode layer 600 penetrating between the first sub-section 510 and the second sub-section 520 and being electrically connected to the auxiliary cathodes 320. Therefore, the resistivity of the whole second electrode layer 600 is reduced, and brightness uniformity of the display panel is improved on the basis of realizing the protection of the electrode body 301 of the auxiliary cathodes 320.

Continuing from the above, in this embodiment, please refer to FIG. 1. A thickness of the second protection electrodes 720 is greater than a thickness of the auxiliary cathodes 320 in a direction perpendicular to the substrate 100.

The undercut opening 430 is defined corresponding to the second protection electrodes 720. The second electrode layer 600 is disposed on the first sub-section 510, the second sub-section 520, and the auxiliary cathodes 320, and the second electrode layer 600 penetrates through the undercut opening 430 and is electrically connected to the second protection electrodes 720.

It can be understood that the thickness of the second protection electrodes 720 in the direction perpendicular to the substrate 100 is greater than the thickness of the auxiliary cathodes 320 in the direction perpendicular to the substrate 100, and the undercut opening 430 is defined corresponding to the second protection electrodes 720, i.e., the undercut opening 430 is defined corresponding the portion of the second protection electrode 720 higher than the auxiliary cathode 320 to make the second protection electrode 720 be exposed at a position of the undercut opening 430. Therefore, it is facilitate to the second electrode layer 600 penetrating through the undercut opening 430 and being electrically connected to the second protection electrodes 720, which makes the auxiliary cathode 320 be electrically connected to the second protection electrode 720 and the auxiliary cathode 320 simultaneously, so a better effect of reducing the resistivity is achieved.

Specifically, in this embodiment, please refer to FIG. 1. The second protection electrodes 720 include a protection segment 721 disposed on the thin film transistor layer 200 and a connection segment 722 extending from the protection segment 721 to a side away from the thin film transistor layer 200. The protection segment 721 is connected to a lateral side of the oxidation protection sub-layer 302 of the auxiliary cathodes 320. The undercut opening 430 is defined corresponding to the connection segment 722. The second electrode layer 600 penetrates through the undercut opening 430 and is electrically connected to the connection segment 722.

It can be understood that the second protection electrodes 720 include the protection segment disposed on the thin film transistor layer 200 and the connection segment 722 extending from the protection segment 721 to a side away from the thin film transistor layer 200, and the protection segment 721 configured to be connected to the oxidation protection sub-layer 302 of the auxiliary cathodes 721 to form the protection cavity, so that the electrode body 301 of the auxiliary cathode 320 is protected, thereby preventing the peripheral side of the auxiliary cathodes 320 from being soaked in the developer solution and corroded. The undercut opening 430 is defined corresponding to the connecting segment 722, which is facilitate to the second electrode layer 600 penetrating through the undercut opening 430 and being electrically connected to the connection segment 722.

In this embodiment, when a depth of the undercut opening 430 is relatively small, the organic light-emitting layer 500 cannot be cut at a position of the undercut opening 430, which is prone to cause connection between the second electrode layer 600 and the auxiliary cathodes 320 to be failure; or when the depth of the undercut opening 430 is too large, in a process of manufacturing the second electrode layer 600, which is prone to cause the second electrode layer 600 cannot be able to penetrate through the undercut opening 430 and to be electrically connected to the second protection electrode 720. Specifically, the depth of the undercut opening 430 ranges from 2 μm to 5 μm in a direction parallel to the substrate.

It should be noted that, in this embodiment, as illustrated in FIG. 1, FIG. 3, and FIG. 9, the thin film transistor layer 200 can include an active layer 210, a gate insulation layer 220, a first metal layer 230, a first insulation layer 240, a second metal layer 250, a second insulation layer 260, and a planarization layer 270 disposed in a stack. The first metal layer 230 can include a gate electrode disposed corresponding to the active layer 210. The second metal layer 250 can include a source electrode 251 and a drain electrode 252 connected to two side of the active layer 210, and a signal wiring 253. The drain electrode 252 can be connected to the anode 310. The signal wiring 253 can be connected to the auxiliary cathode 320, and redundant description will not be mentioned herein again.

As illustrated in FIG. 2 to FIG. 9, the present application further provides a manufacturing method of the display panel, including following steps.

Step S100: providing a substrate 100; forming a thin film transistor layer 200 on the substrate 100.

Step S200: forming a first electrode layer 300 and protection electrodes 700 on the thin film transistor layer 200, wherein the first electrode layer 300 includes a plurality of electrodes, and the protection electrodes 700 are disposed around peripheral sides of the electrodes.

Wherein, the electrodes include an electrode body 301 disposed on the thin film transistor layer 200 and an oxidation protection sub-layer 302 formed on the electrode body 301, in one of the electrodes and one corresponding protection electrode 700, the protection electrode 700 and the oxidation protection sub-layer 302 are connected to form a protection cavity, and the electrode body 301 is disposed in the protection cavity.

Step S300: forming a pixel definition layer 400 on the thin film transistor layer 200, wherein openings corresponding to each of the electrodes one by one are formed in the pixel definition layer 400, and one of protection electrodes 700 is disposed between one of the electrodes and the pixel definition layer 400.

Step S400: at least forming an organic light-emitting layer 500 on the first electrode layer 300, and forming a second electrode layer 600 on the organic light-emitting layer 500.

Figure 5:
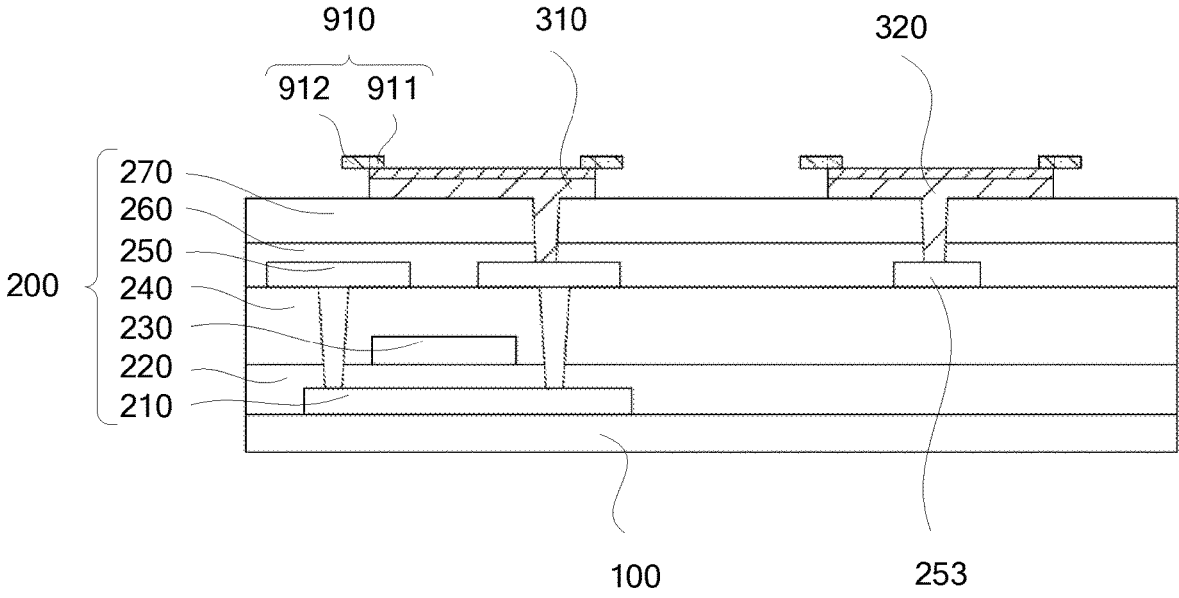
Figure 6:
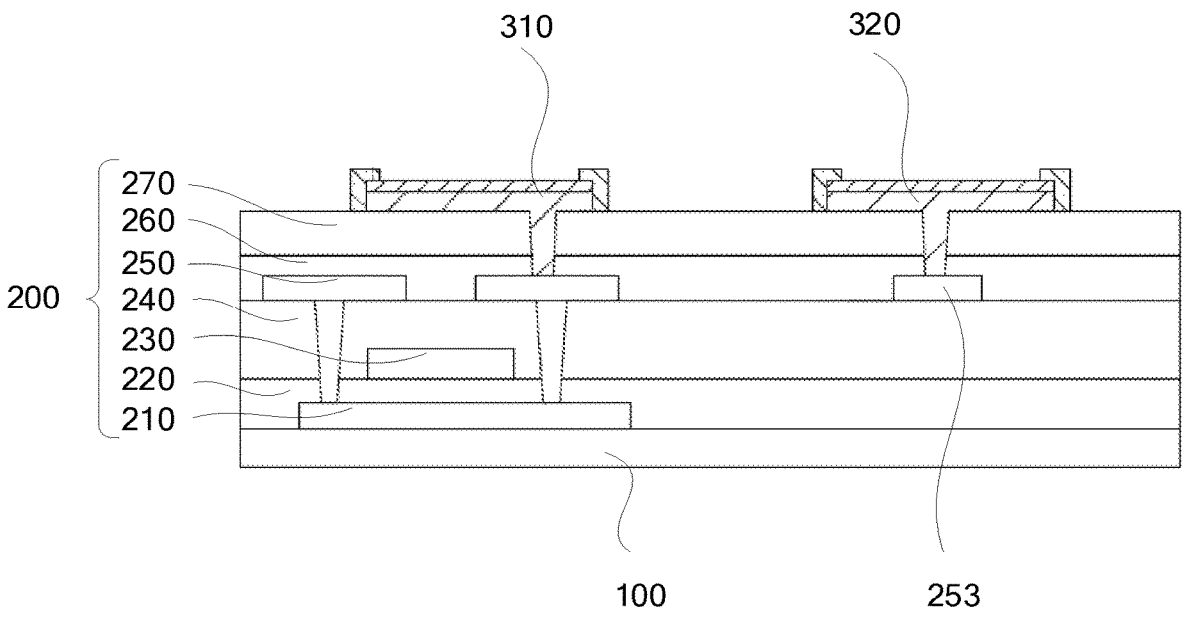
Figure 7:
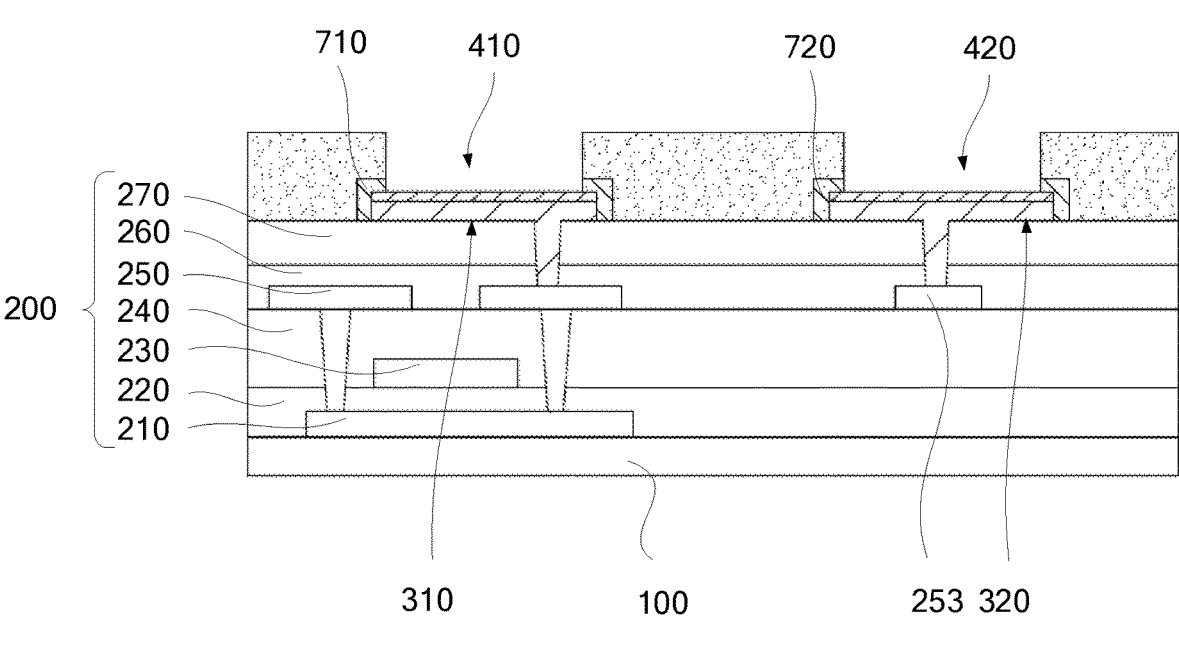

Please refer to FIG. 5 to FIG. 7. It can be understood that before manufacturing the pixel definition layer 400, by forming the protection electrodes 700 located on the thin film transistor layer 200 on the peripheral sides of the electrodes, by forming one protection cavity through connecting the protection electrode 700 and the oxidation protection sub-layer 302, and by disposing the electrode body 301 in the protection cavity, a surface of a peripheral side of the electrode body 301 can be protected, and the problem of corrosion of the peripheral side of the electrode body incurred by the developer solution contacting to the electrode body during the manufacturing process of the line banks can be prevented.

Please refer to FIG. 3 to FIG. 6. In this embodiment, the step S200: forming the first electrode layer 300 and the protection electrodes 700 on the thin film transistor layer 200 includes:

forming an electrode metal layer 800 on the thin film transistor layer 200, and forming a metal protection layer 900 on the electrode metal layer 800;

patterning the electrode metal layer 800 and the metal protection layer 900, wherein the patterned electrode metal layer 800 forms the first electrode layer 300, the first electrode layer 300 includes a plurality of electrodes, and the electrodes include the electrode body 301 formed on the thin film transistor layer 200 and the oxidation protection sub-layer 302 formed on the electrode body 301, the patterned metal protection layer 900 forms a metal protection portion 910 at an edge of the electrodes, the metal protection portion 910 includes a first segment 911 located on the electrodes and a second segment 912 suspended out of the edge of the electrodes; and adopting a plasma process to make the second segment 912 be bent toward a direction close to the thin film transistor layer 200 to form the protection electrode 700.

As illustrated in FIG. 5, it should be noted that a length of the second segment 912 suspended out of the edge of the electrodes should be greater than the thickness of the first electrode layer 300, which is convenient for the second segment 912 to contact to the thin film transistor layer 200 after being bent in a direction close to the thin film transistor layer 200, so as to cover the peripheral side of the electrodes. Specifically, the thickness of the first electrode layer 300 can range from 1000 angstroms to 3000 angstroms, and a length of the second segment 912 is longer than 3500 angstroms. In addition, in the step of adopting the plasma process to make the second segment 912 be bent toward the direction close to the thin film transistor layer 200, the plasma process can be adopted to bombard the second segment 912 to make the second segment 912 be bent toward the direction close to the thin film transistor layer 200, so as to cover the peripheral side of the electrodes 700. Specifically, in the plasma process, a plasma power ranges from 400 W to 700 W, and a plasma pressure ranges from 10 mt to 50 mt.

In this embodiment, the plurality of electrodes include a plurality of anodes 310, the plurality of openings include a plurality of first openings 410 corresponding to each of the anodes 310 one by one, the plurality of protection electrodes 700 include a plurality of first protection electrodes 710, one of the first protection electrodes 710 located on the thin film transistor layer 200 is disposed between one of the anodes 310 and the pixel definition layer 400, the plurality of openings include a plurality of second openings 420 corresponding to each of the auxiliary cathodes 320 one by one, the plurality of protection electrodes 700 include a plurality of second protection electrodes 720, and one of the second protection electrodes 720 located on the thin film transistor layer 200 is disposed between one of the auxiliary cathodes 320 and the pixel definition layer 400.

The first protection electrodes 710 include a vertical portion 711 disposed on the thin film transistor layer 200 and connected to a lateral side of the oxidation protection sub-layer 302 and a horizontal portion 712 horizontally extending in a direction from the vertical portion 711 to the first openings 410, and the horizontal portion 712 is at least partially disposed on the oxidation protection sub-layer 302.

It can be understood that in the step S200: forming the protection electrodes 700 on the thin film transistor layer 200, and after the step of adopting the plasma process to make the second segment 912 be bent toward the direction close to the thin film transistor layer 200 to form the protection electrode 700, that is, the first segment 911 forms the horizontal portion 712 of the first protection electrode 710, and the second segment 912 forms the vertical portion 711 of the first protection electrode 710.

In this embodiment, the plurality of electrodes include a plurality of auxiliary cathodes 320, the plurality of openings include a plurality of second openings 420 corresponding to each of the auxiliary cathodes 320 one by one, the plurality of protection electrodes 700 include a plurality of second protection electrodes 720, and one of the second protection electrodes 720 located on the thin film transistor layer 200 is disposed between one of the auxiliary cathodes 320 and the pixel definition layer 400.

An undercut opening 430 located between the pixel definition layer 400 and the auxiliary cathodes 320 is defined on a lateral wall of the second openings 420. The organic light-emitting layer 500 includes a first sub-section 510 disposed on the pixel definition layer 400 and a second sub-section 520 disposed on the auxiliary cathodes 320. The first sub-section 510 and the second sub-section 520 are spaced apart. The second electrode layer 600 is disposed on the first sub-section 510, the second sub-section 520, and the auxiliary cathodes 320, and is connected to the auxiliary cathodes 320.

Please refer to FIG. 7 to FIG. 8. It can be understood that after the step S300: forming the pixel definition layer 400 on the thin film transistor layer 200, the method further includes:

at least partially etching the first segment 911 located at the second opening 420 to form an undercut opening 430 on a lateral wall of the second opening 420.

Correspondingly, the present application further provides a display device. The display device includes the display panel as mentioned in previous embodiments.

In summary, in the present application, by disposing one protection electrode 700 located on the thin film transistor layer 200 between the electrode and the pixel definition layer 400, and by disposing the protection electrodes 700 around peripheral sides of the electrodes, the peripheral sides of the electrodes 700 can be protected by the protection electrodes, and the problem of corrosion of the peripheral sides of the electrodes due to the developer solution contacting to the peripheral sides of the electrodes during the manufacturing process of the line banks can be prevented.

In summary, although the present invention has disclosed the preferred embodiments as above, however the above-mentioned preferred embodiments are not to limit to the present invention. A person skilled in the art can make any change and modification, therefore the scope of protection of the present invention is subject to the scope defined by the claims.

What is claimed is:

1. A display panel, comprising:

a substrate;

a thin film transistor layer disposed on the substrate;

a first electrode layer disposed on the thin film transistor layer and comprising a plurality of anodes, and a plurality of auxiliary cathodes, the plurality of anodes and the plurality of auxiliary cathodes being arranged on a same layer;

a pixel definition layer disposed on the thin film transistor layer and comprising a plurality of first openings corresponding to each of the anodes one by one and a plurality of second openings corresponding to each of the auxiliary cathodes one by one;

an organic light-emitting layer at least disposed on the first electrode layer corresponding to the first openings and the second openings; and a second electrode layer disposed on the organic light-emitting layer, and wherein one of first protection electrodes located on the thin film transistor layer is disposed between one of the anodes and the pixel definition layer, one of the first protection electrodes is disposed around a peripheral side of one of the anodes, one of the first protection electrodes comprises a vertical portion connected to a lateral side of one of the anodes and a horizontal portion horizontally extending in a direction from the vertical portion to one of the first openings, the horizontal portion is at least partially disposed on the anode;

wherein one of second protection electrodes located on the thin film transistor layer is disposed between one of the auxiliary cathodes and the pixel definition layer, one of the second protection electrodes is disposed around a peripheral side of one of the auxiliary cathodes, and an undercut opening located between the pixel definition layer and one of the auxiliary cathodes is defined on a lateral wall of one of the second openings; and wherein the undercut opening is defined corresponding to one of the second protection electrodes, the second electrode layer is disposed on the pixel definition layer and the auxiliary cathodes, and the second electrode layer penetrates through the undercut openings and is electrically connected to the second protection electrodes.

2. The display panel as claimed in claim 1, wherein one of the anodes or the auxiliary electrodes comprises an electrode body disposed on the thin film transistor layer and an oxidation protection sub-layer disposed on the electrode body;

in one of the anodes or the auxiliary electrodes and one corresponding first protection electrode or second protection electrode, the first protection electrode or second protection electrode and the oxidation protection sub-layer are connected to form a protection cavity, and the electrode body is disposed in the protection cavity.

3. The display panel as claimed in claim 2, wherein the vertical portion is disposed on the thin film transistor layer and connected to a lateral side of the oxidation protection sub-layer, and the horizontal portion is at least partially disposed on the oxidation protection sub-layer.

4. The display panel as claimed in claim 3, wherein a thickness of the horizontal portion is less than a thickness of the organic light-emitting layer in a direction perpendicular to the substrate.

5. The display panel as claimed in claim 3, wherein the organic light-emitting layer comprises a first sub-section disposed on the pixel definition layer and a second sub-section disposed on the auxiliary cathodes, the first sub-section and the second sub-section are spaced apart, and the second electrode layer is disposed on the first sub-section, the second sub-section, and the auxiliary cathodes, and is connected to the auxiliary cathodes.

6. The display panel as claimed in claim 5, wherein a thickness of one of the second protection electrodes is greater than a thickness of one of the auxiliary cathodes in a direction perpendicular to the substrate, and the second electrode layer is disposed on the first sub-section, the second sub-section, and the auxiliary cathodes.

7. The display panel as claimed in claim 6, wherein one of the second protection electrodes comprise a protection segment disposed on the thin film transistor layer and a connection segment extending from the protection segment to a side away from the thin film transistor layer, the protection segment is connected to a lateral side of the oxidation protection sub-layer of one of the auxiliary cathodes, the undercut opening is defined corresponding to the connection segment, and the second electrode layer penetrates through the undercut opening and is electrically connected to the connection segment.

8. The display panel as claimed in claim 5, wherein a depth of the undercut opening ranges from 2 μm to 5 μm in a direction parallel to the substrate.

9. The display panel as claimed in claim 1, wherein a material of the first protection electrodes or the second protection electrodes comprises at least one of an alloy of molybdenum and titanium or titanium.

10. A manufacturing method of a display panel, comprising following steps:

providing a substrate; forming a thin film transistor layer on the substrate;

forming a first electrode layer and protection electrodes on the thin film transistor layer, wherein the first electrode layer comprises a plurality of anodes and a plurality of auxiliary cathodes, the plurality of anodes and the plurality of auxiliary cathodes being arranged on a same layer, the protection electrodes comprise a plurality of first protection electrodes and a plurality of second protection electrodes, one of the first protection electrodes is disposed around a peripheral side of one of the anodes, and one of the second protection electrodes is disposed around a peripheral side of one of the auxiliary cathodes;

forming a pixel definition layer on the thin film transistor layer, wherein a plurality of first openings corresponding to each of the anodes one by one and a plurality of second openings corresponding to each of the auxiliary cathodes one by one are formed in the pixel definition layer, one of the first protection electrodes located on the thin film transistor layer is disposed between one of the anodes and the pixel definition layer, and one of the second protection electrodes located on the thin film transistor layer is disposed between one of the auxiliary cathodes and the pixel definition layer;

at least forming an organic light-emitting layer on the first electrode layer;

forming a second electrode layer on the organic light-emitting layer; and forming an undercut opening on a lateral wall of one of the second openings, wherein the undercut opening is located between the pixel definition layer and one of the auxiliary cathodes; and wherein one of the first protection electrodes comprise a vertical portion connected to a lateral side of one of the anodes and a horizontal portion horizontally extending in a direction from the vertical portion to one of the first openings, the horizontal portion is at least partially disposed on the anode, the undercut opening is defined corresponding to one of the second protection electrodes, the second electrode layer is disposed on the pixel definition layer and the auxiliary cathodes, and the second electrode layer penetrates through the undercut openings and is electrically connected to the second protection electrodes.

11. A display device, wherein the display device comprises a display panel, and the display panel comprises:

a substrate;

a thin film transistor layer disposed on the substrate;

a first electrode layer disposed on the thin film transistor layer and comprising a plurality of anodes, and a plurality of auxiliary cathodes, the plurality of anodes and the plurality of auxiliary cathodes being arranged on a same layer;

a pixel definition layer disposed on the thin film transistor layer and comprising a plurality of first openings corresponding to each of the anodes one by one and a plurality of second openings corresponding to each of the auxiliary cathodes one by one;

an organic light-emitting layer at least disposed on the first electrode layer corresponding to the first openings and the second openings; and a second electrode layer disposed on the organic light-emitting layer, and wherein one of first protection electrodes located on the thin film transistor layer is disposed between one of the anodes and the pixel definition layer, one of the first protection electrodes is disposed around a peripheral side of one of the anodes, one of the first protection electrodes comprises a vertical portion connected to a lateral side of one of the anodes and a horizontal portion horizontally extending in a direction from the vertical portion to one of the first openings, the horizontal portion is at least partially disposed on the anode;

wherein one of second protection electrodes located on the thin film transistor layer is disposed between one of the auxiliary cathodes and the pixel definition layer, one of the second protection electrodes is disposed around a peripheral side of one of the auxiliary cathodes, and an undercut opening located between the pixel definition layer and one of the auxiliary cathodes is defined on a lateral wall of one of the second openings; and wherein the undercut opening is defined corresponding to one of the second protection electrodes, the second electrode layer is disposed on the pixel definition layer and the auxiliary cathodes, and the second electrode layer penetrates through the undercut openings and is electrically connected to the second protection electrodes.

12. The display device as claimed in claim 11, wherein one of the anodes or the auxiliary electrodes comprises an electrode body disposed on the thin film transistor layer and an oxidation protection sub-layer disposed on the electrode body;

in one of the anodes or the auxiliary electrodes and one corresponding first protection electrode or second protection electrode, the first protection electrode or second protection electrode and the oxidation protection sub-layer are connected to form a protection cavity, and the electrode body is disposed in the protection cavity.

13. The display device as claimed in claim 12, wherein, the vertical portion is disposed on the thin film transistor layer and connected to a lateral side of the oxidation protection sub-layer, and the horizontal portion is at least partially disposed on the oxidation protection sub-layer.

14. The display device as claimed in claim 13, wherein a thickness of the horizontal portion is less than a thickness of the organic light-emitting layer in a direction perpendicular to the substrate.

15. The display device as claimed in claim 13, wherein the organic light-emitting layer comprises a first sub-section disposed on the pixel definition layer and a second sub-section disposed on the auxiliary cathodes, the first sub-section and the second sub-section are spaced apart, and the second electrode layer is disposed on the first sub-section, the second sub-section, and the auxiliary cathodes, and is connected to the auxiliary cathodes.

16. The display device as claimed in claim 15, wherein a thickness of one of the second protection electrodes is greater than a thickness of one of the auxiliary cathodes in a direction perpendicular to the substrate, and the second electrode layer is disposed on the first sub-section, the second sub-section, and the auxiliary cathodes.

17. The display device as claimed in claim 16, wherein one of the second protection electrodes comprise a protection segment disposed on the thin film transistor layer and a connection segment extending from the protection segment to a side away from the thin film transistor layer, the protection segment is connected to a lateral side of the oxidation protection sub-layer of one of the auxiliary cathodes, the undercut opening is defined corresponding to the connection segment, and the second electrode layer penetrates through the undercut opening and is electrically connected to the connection segment.

18. The display device as claimed in claim 15, wherein a depth of the undercut opening ranges from 2 μm to 5 μm in a direction parallel to the substrate.

19. The display device as claimed in claim 11, wherein a material of the first protection electrodes or the second protection electrodes comprises at least one of an alloy of molybdenum and titanium or titanium.

\* \* \* \* \*